(12) United States Patent
Peterson et al.

(10) Patent No.: US 11,353,496 B2
(45) Date of Patent: Jun. 7, 2022

(54) FREQUENCY-BASED BUILT-IN-TEST FOR DISCRETE OUTPUTS

(71) Applicant: Hamilton Sundstrand Corporation, Charlotte, NC (US)

(72) Inventors: Kevin C. Peterson, Bloomington, IL (US); Michael A. Wilson, Scottsdale, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 269 days.

(21) Appl. No.: 16/406,522

(22) Filed: May 8, 2019

(65) Prior Publication Data

US 2020/0355739 A1 Nov. 12, 2020

(51) Int. Cl.
*G01R 31/28* (2006.01)

(52) U.S. Cl.
CPC ..... *G01R 31/2837* (2013.01); *G01R 31/2843* (2013.01)

(58) Field of Classification Search
CPC ............ G01R 31/2837; G01R 31/2843; G01R 31/2882; G01R 31/31813; G01R 31/31917; G01R 31/31919; G01R 31/31921; G01R 31/31922; G01R 31/31924; G01R 31/31926; G01R 31/31928;
(Continued)

(56) References Cited

U.S. PATENT DOCUMENTS 3,614,608 A * 10/1971 Giedd ................ G01R 31/3193
714/736
4,216,533 A * 8/1980 Ichimiya .......... G01R 31/31919
365/189.04
(Continued)

FOREIGN PATENT DOCUMENTS

JP   2000329826 A   11/2000
JP   2011/114668 A   6/2011

OTHER PUBLICATIONS

Extended European Search Report dated Jun. 9, 2020, issued during the prosecution of European Patent Application No. EP 19212871.8.

*Primary Examiner* — Steven L Yeninas
(74) *Attorney, Agent, or Firm* — Locke Lord LLP; Scott D. Wofsy; Judy R. Naamat

(57) ABSTRACT

A method is provided for testing discrete output signals of a device-under-test (DUT). The method includes receiving an electrical quantity at each conductive path of a plurality of conductive paths that are each coupled to respective discrete output signals of the DUT in one-to-one correspondence. The method further includes controlling application of the electrical quantity to each of the conductive path independent of application of the electrical quantity along the other conductive paths, so that a the electrical quantity is applied simultaneously to all of the conductive paths, the electrical quantity applied to each conductive path being toggled at a unique frequency having a unique period. Accordingly, a characteristic of the electrical quantity at each of the respective test output conductors over the duration of the longest (Continued)

period of the unique periods is indicative of any disturbance between the discrete output signals associated with the test output conductor and all of the other discrete output signals.

18 Claims, 10 Drawing Sheets

(58) Field of Classification Search
 CPC .......... G01R 31/3193; G01R 31/31932; G01R 31/31935; G01R 31/31937
 See application file for complete search history.

(56) References Cited

U.S. PATENT DOCUMENTS

| | | | | |
|---|---|---|---|---|
| 4,849,702 A * | 7/1989 | West | ................ | G01R 31/31713 327/160 |
| 5,737,693 A | 4/1998 | Aldridge et al. | | |
| 5,760,599 A * | 6/1998 | Ehiro | ............... | G01R 31/31924 324/762.09 |
| 7,003,697 B2 * | 2/2006 | Magliocco | ......... | G01R 31/3183 714/25 |
| 7,006,936 B2 * | 2/2006 | Matsui | ................... | G01R 29/02 327/175 |
| 7,143,323 B2 * | 11/2006 | Sweet | .............. | G01R 31/31709 714/724 |
| 7,636,877 B2 * | 12/2009 | Fujisaki | ........... | G11C 29/56008 714/736 |
| 7,716,541 B2 * | 5/2010 | Yamada | .......... | G01R 31/31813 714/718 |
| 2004/0239310 A1 * | 12/2004 | Oshima | ............ | G01R 31/31922 324/750.01 |
| 2005/0093561 A1 * | 5/2005 | Watanabe | ........ | G01R 31/31703 324/762.02 |
| 2006/0031731 A1 * | 2/2006 | Ishida | ................ | G01R 31/2882 714/738 |
| 2008/0189581 A1 * | 8/2008 | Femal | .............. | G01R 31/31917 714/715 |
| 2008/0297190 A1 * | 12/2008 | Kwak | .............. | G01R 31/31922 324/750.3 |
| 2009/0003424 A1 * | 1/2009 | Waayers | .......... | G01R 31/31858 375/226 |
| 2009/0031731 A1 * | 2/2009 | Ziminsky | .................. | F02C 9/40 60/777 |
| 2009/0134905 A1 * | 5/2009 | Long | ........... | G01R 31/2853 324/763.01 |
| 2010/0271063 A1 * | 10/2010 | Hasegawa | .............. | G11C 29/56 324/756.04 |
| 2011/0109321 A1 * | 5/2011 | Kawabata | .......... | G01R 31/3167 324/555 |
| 2013/0002277 A1 * | 1/2013 | Song | ................ | G01R 31/31908 324/750.3 |

* cited by examiner

Unexpected Capacitance on Trace 404

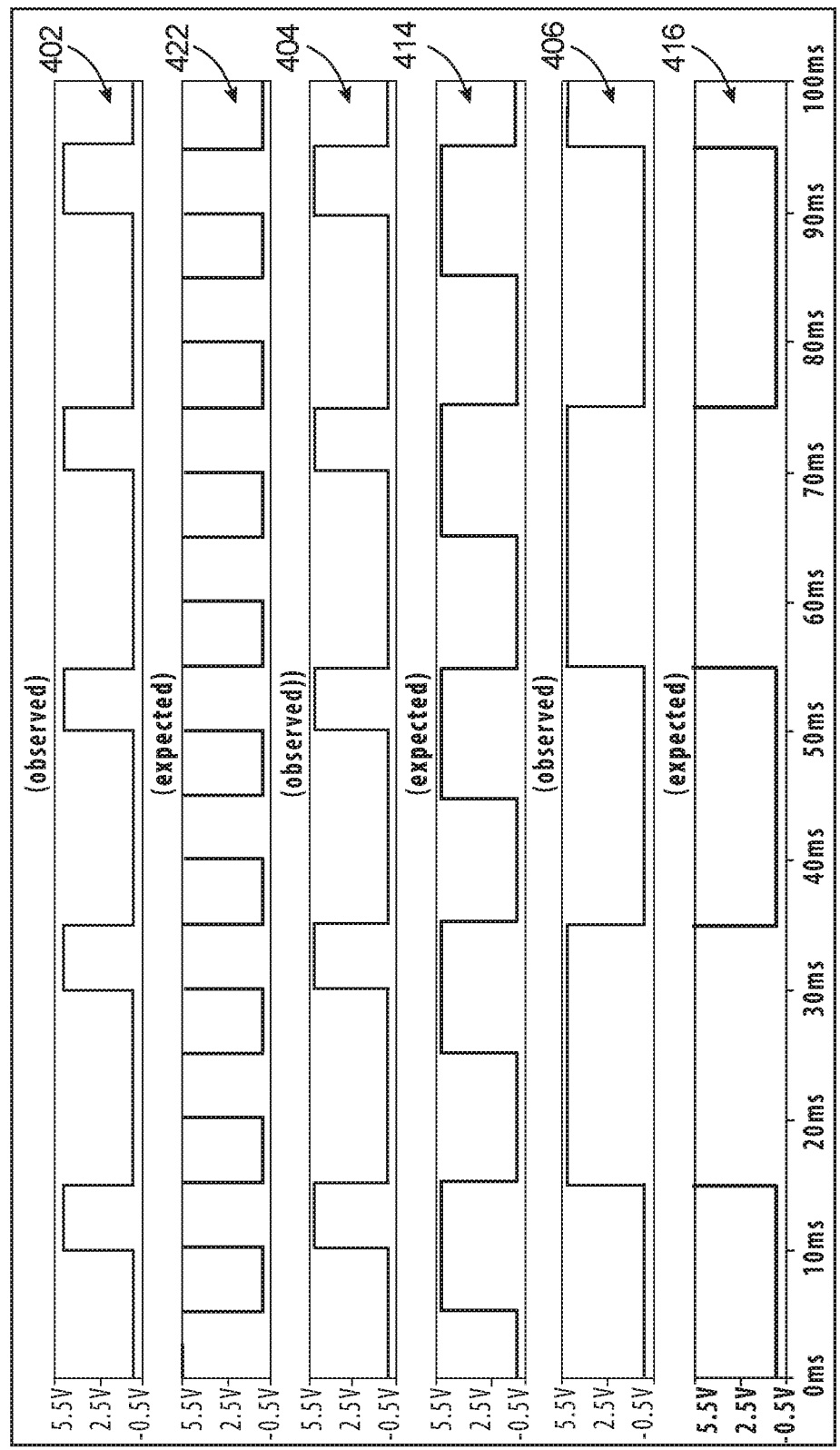

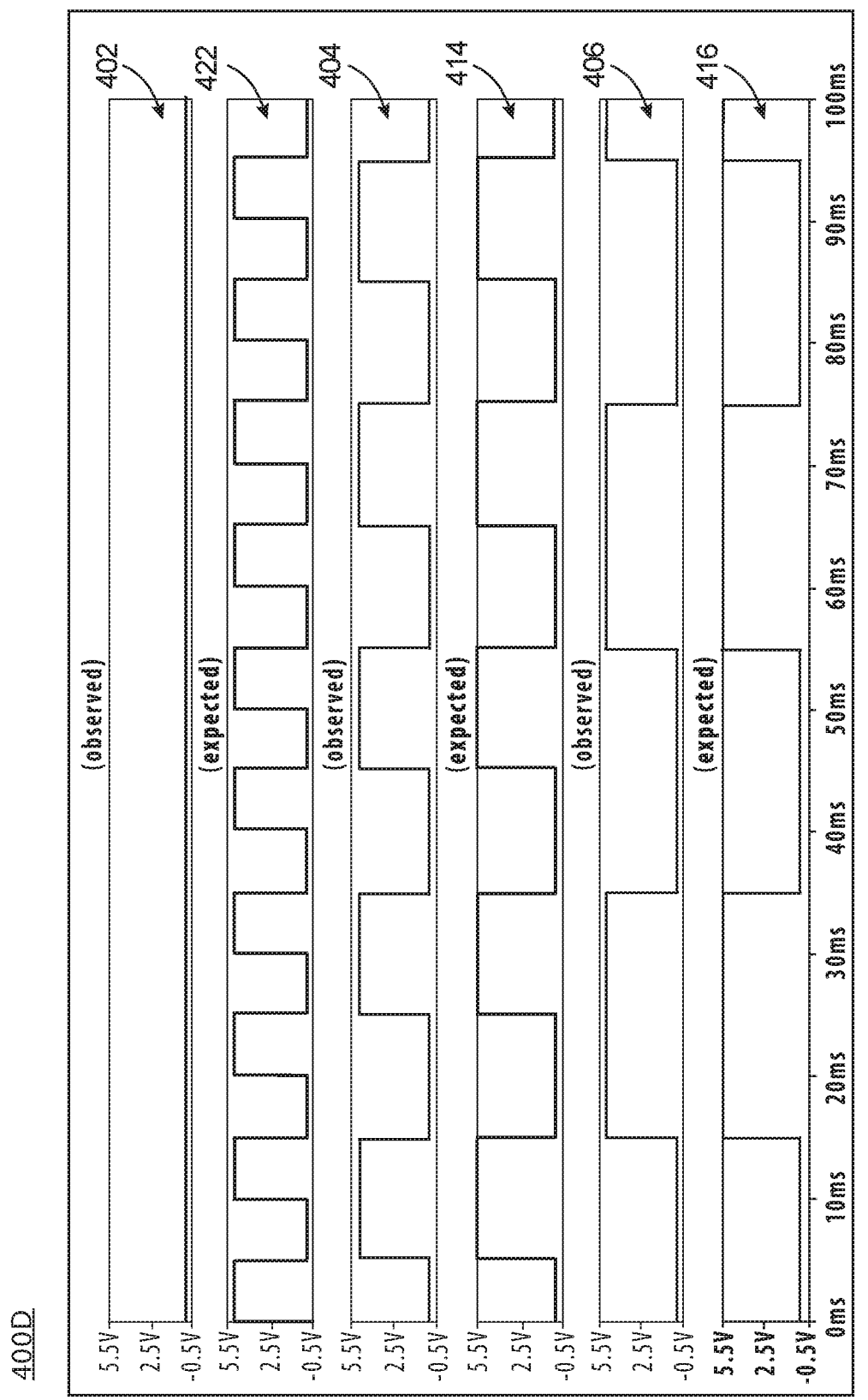

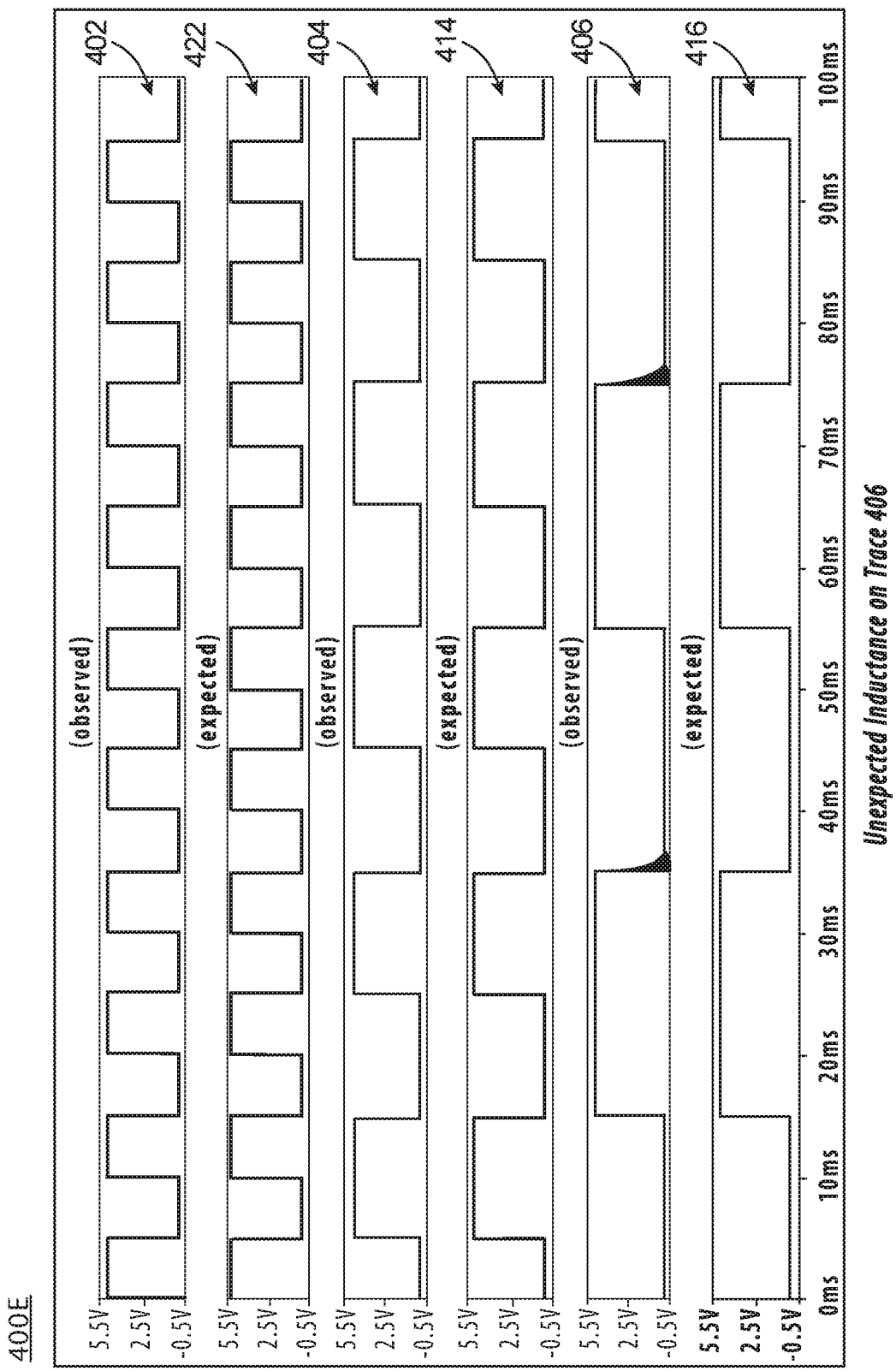

FREQUENCY-BASED BUILT-IN-TEST FOR DISCRETE OUTPUTS

BACKGROUND

1. Field of the Disclosure

The present disclosure relates to built-in testing of a device under test (DUT), and more particularly, to a frequency-based built-in testing of a DUT.

2. Description of Related Art

Built-in-testing of a device under test (DUT) can be performed by designing and creating a customized device, such as a breakout box, for testing or troubleshooting a particular device. The testing can include detecting any short or open circuits in circuitry for outputting discrete output signals of the DUT. Design and creation of a breakout box may be a practical approach in certain circumstances, such as when testing DUTs that are a final product that has been manufactured in large quantities. However, it can be impractical, uneconomical, and inefficient when the DUT is an engineering prototype that is not yet a final product. Such prototypes can be tested using manual stimulation and measurement of discrete output signals. This testing can be a time-consuming process, particularly when testing every combination of output state. While conventional methods and systems have generally been considered satisfactory for their intended purpose, there is still a need in the art for a system and method that is practical, economical, and efficient for testing DUTs that are still in the prototype stage.

SUMMARY

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, disclosed is a testing device for testing discrete output signals of a device under test (DUT). The testing device includes a plurality of test output conductors for receiving an electrical quantity, the electrical quantity being voltage, current, or charge, and coupling to respective discrete output signals of the DUT in one-to-one correspondence. A control circuit is provided for independently controlling application of the electrical quantity to each test output conductor of the plurality of test output conductors, wherein the application of the electrical quantity is controlled independently for each test output conductor so that an electrical quantity is applied simultaneously to all of the test output conductors, and the electrical quantity applied to each supply conductors is toggled at a unique frequency having a unique period. Accordingly, a characteristic of the electrical quantity at each of the respective test output conductors over the duration of the longest period of the unique periods is indicative of any disturbance between the discrete output signals associated with the test output conductor and all of the other discrete output signals.

In another aspect, disclosed is a method for testing discrete output signals of a DUT. The method includes receiving an electrical quantity at each conductive path of a plurality of conductive paths that are each coupled to respective discrete output signals of the DUT in one-to-one correspondence. The method further includes controlling application of the electrical quantity to each of the conductive path independent of application of the electrical quantity along the other conductive paths, so that an electrical quantity is applied simultaneously to all of the conductive paths, the electrical quantity applied to each conductive path being toggled at a unique frequency having a unique period. Accordingly, a characteristic of the electrical quantity at each of the respective test output conductors over the duration of the longest period of the unique periods is indicative of any disturbance between the discrete output signals associated with the test output conductor and all of the other discrete output signals.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIGS. 4A-4E are plots of traces that correspond to observed discrete output signals and expected discrete output signals;

DETAILED DESCRIPTION OF THE EMBODIMENTS

A testing device is disclosed that is configured for testing discrete output signals of a device under test (DUT). The testing device controls application of charge by individual test output conductors, each coupled to a discrete output conductor of the DUT in one-to-one correspondence so that each of the test output conductors is coupled to one discrete output conductor of the DUT. The testing device controls the application of charge so that all of the test output conductors apply a charge simultaneously, where the charge applied by each test output conductor to its corresponding discrete output conductor is toggled at a unique frequency having a unique period. In this fashion, any disturbance between the discrete output signal associated with the discrete output conductor and all of the other discrete output signals can be detected by monitoring or measuring a characteristic of the discrete output signals over the duration of a period of the frequency.

Figure 1:
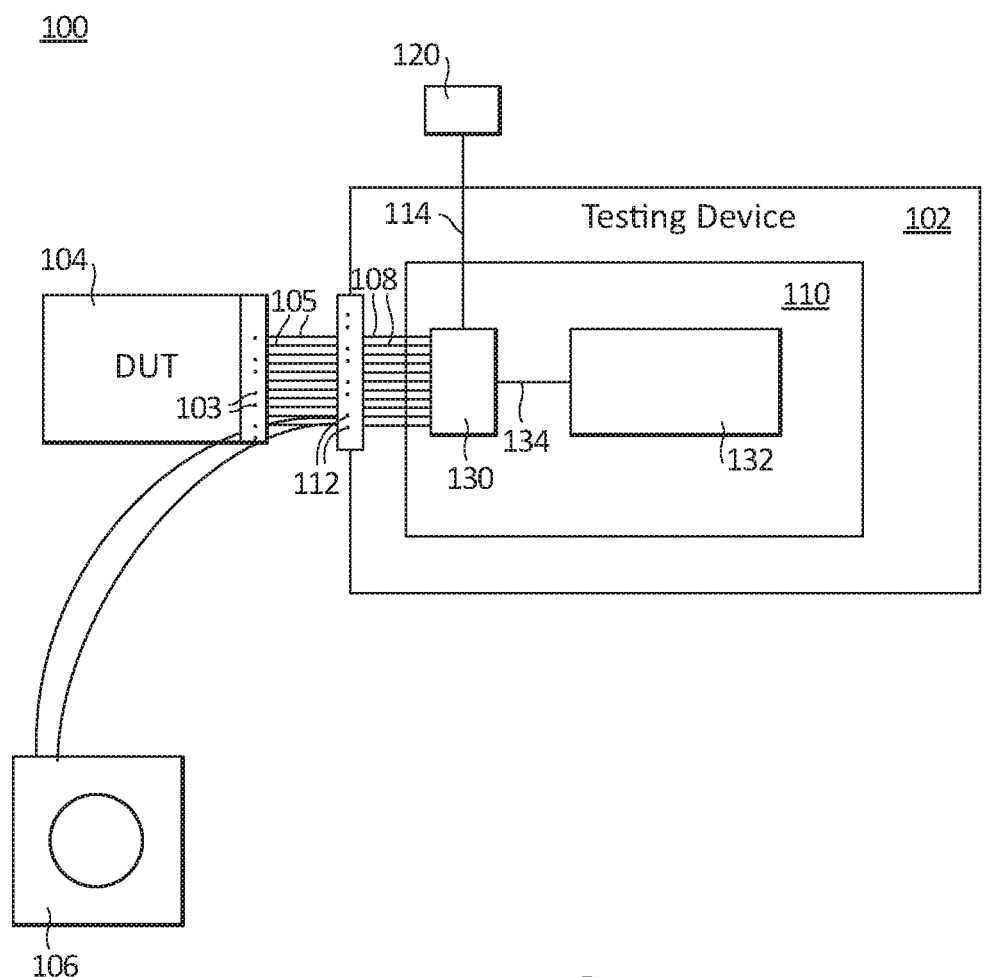
FIG. 1 is a block diagram for an example testing device in accordance with embodiments of the disclosure.

FIG. 1 is a diagram illustrating an operating environment 100 for embodiments of an example testing device 102 that is configured to test a DUT 104 having discrete output signals, each discrete output signal associated with a respective discrete output conductor 105. The discrete output conductor 105 can include a male interface (e.g., a pin, etc.) or a female interface (e.g., receptor for a pin, etc.) that can couple to the testing device 102.

The testing device 102 includes a plurality of test output conductors 108, a control circuit 110, and multiple output ports 112. At least one charge source 120 delivers a charge via at least one charge lead 114 to the test output conductors 108 via the control circuit 110. Each test output conductor 108 is coupled to one of the respective discrete output conductors 105 of the DUT 104 in one-to-one correspondence. The test output conductors 108 and discrete output conductors 105 can couple (physically and electrically) directly to one another, or can couple via a port 112. The port 112 at the end of each test output conductor 108 can have a female or male interface configured to mate with the interface of the corresponding discrete output conductor 105. At least one charge source 120 applies a charge to the respective test output conductors 108. The control circuit 110 controls application of charge by each of the test output conductors 108 to its corresponding discrete output conductor 105 via the corresponding port 112. The application of charge is controlled so that all of the test output conductors 108 apply a charge simultaneously to their respective discrete output conductors 105, wherein application of the charge is controlled so that the charge is toggled between a high value and a low value at a unique frequency having a unique period. The unique frequencies are ordered so that each unique frequency is increased relative to a preceding frequency by a factor of two, meaning if the lowest frequency is "f", then the other frequencies are "2f," "4f," "8f," "16f," etc. The shortest period of the unique frequencies applied to the test output conductors 108 is bound by capabilities of the discrete output signals themselves to physically switch from a high state to a low state.

Over the course of simultaneous application of the charge to each of the test output conductors 108 for the duration of the longest period of the unique frequencies used, each possible combination of charge applications to the discrete output conductors 105 is achieved. The discrete output signal provided at one of the discrete output conductor 105 can be tested (observed and/or measured) for the duration of the longest period. The observed or measured discrete output signal (referred to as the observed discrete output signal) provides an indication of any disturbance between the discrete output conductor 105 being tested (and its discrete output signal) and all of the other discrete output conductors 105 (and their respective discrete output signals). When no disturbance is present, the observed discrete output signal will have the same waveform as an expected waveform. The expected waveform can be the waveform of the charge applied the test output conductor 108.

When a disturbance exists, the observed discrete output signal will have a different waveform than the expected waveform. Disturbances can include, for example, any short (to ground or to another discrete output conductor 105) or an open circuit that includes the discrete output conductor 108 being tested, an unexpected capacitance developing at the discrete output conductor 108 being tested, or an unexpected inductance developing at the discrete output conductor 108 being tested. Examples of expected waveforms and waveforms indicative of disturbances are shown in FIGS. 4A-4E.

FIG. 1 further shows a measuring device 106, such as an oscilloscope, that measures, and optionally provides a display for observing the charge or behavior of the display signal of the respective discrete output conductor 105 over the duration of a period of the frequency. The measurements can be stored and analyzed or displayed for observation, such as to determine when the observed display signal differs from an expected charge.

In embodiments, analyzing the measurements can include counting a number of changes between a state of the electrical quantity (e.g., "high" or "low" states) of each discrete output signal. In embodiments, a single or multiple discrete output signals can be observed at once, such as to be displayed as a trace by the measuring device 106 or obtain measurements. Each trace can be obtained by probing one of the discrete output conductors 105 or the corresponding test output conductor 108. An operator can compare each displayed trace to its corresponding expected trace. In embodiments, a processing device (a controller of the control circuit 110 or an external processing device) can analyze output of the measuring device 106, compare the observed discrete output signal(s) to corresponding expected output (s), and generate an alert when the comparison results in a determination that the observed discrete output signal(s) differed from the expected output(s). The analysis can include determining from the comparison what type of disturbance is indicated by the difference between each observed discrete output signal and its corresponding expected output.

The control circuit 110 can include a controller 132 that controls a plurality of switches 130 to control delivery of charge from the charge source 120 via a plurality of leads 114 to the respective test output conductors 108 for controlling delivery of charge at the unique frequency to each of the discrete output conductors 105, and thus to each discrete output.

The testing device 102 can be a programmable logic device (PLD), microprocessor, digital signal processor (DSP), microcontroller, field programmable gate array (FPGA), application specific integrated circuit (ASIC), and/ or other discrete or integrated logic circuitry having similar processing capabilities. The testing device 102 can be provided on an integrated circuit configured to receive the discrete outputs of the DUT 104. For example, the test output conductors 108 can each be coupled to a port 112 of the interface 112 that is configured to receive the interface (e.g., pin) of the discrete output conductor 105 of the DUT 104. The test output conductors 108 can be traces or conductors of the testing device 102. The charge source 120 can be coupled to the integrated circuit such that an individually controlled charge can be applied to each test output conductor 108. The charge source 120 can include one or more voltage, current, or power sources. In embodiments, an individual charge source 120 can be associated with each test output conductors 108.

The DUT 104 is a device that transmits discrete output signals. Each discrete output signal can be transmitted, for example, from a corresponding discrete output port 103 that corresponds to each discrete output conductor 105 in a one-to-one correspondence. The DUT 104 can be, for example, a computing device, a networking device, an electric control unit, etc. The DUT can be an engineering prototype that is not yet a final product.

Figure 2:
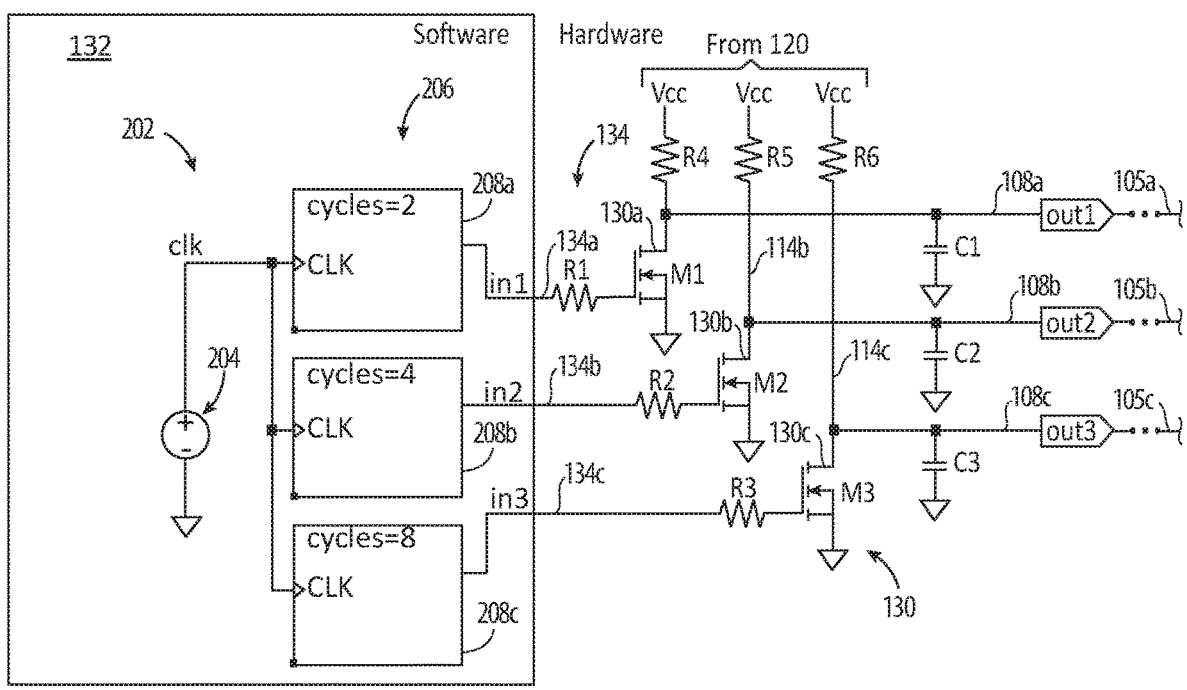
FIG. 2 is a schematic diagram of an example implementation of portion of a testing device in accordance with embodiments of the disclosure, such as the testing device shown in FIG. 1.

With reference to FIG. 2, a schematic diagram of an example implementation of the testing device 102 is shown in which the controller 132 is shown to include a counting circuit 202 configured to count that includes a clock 204 and a clock divider 206. Although the example in FIG. 2 indicates that the counting circuit 202 is implemented in software, the counting circuit 202 can alternatively be implemented in software and/or firmware. The clock divider 206 includes multiple counters 208 (shown as counters 208*a*, 208*b*, 208*c*, without limitation to a particular number of counters), without limitation to a specific number of counters. The counters 208 each correspond to different respective binary bit of a counting value. In this way, each of the counters 208 toggles between a "1" and a "0" at a different frequency.

The counting value is incremented until all of the counters 208 are set (e.g., hold a value="1"), after which all of the counters 208 can be reset (e.g., to hold a value="0"), after which the counting process can be repeated in a loop, if desired. The output of each counter 208 is provided via a corresponding counter conductor 134 (shown as counting conductors 134*a*, 134*b*, 134*c*, without limitation to a particular number of counting conductors) to control one of the respective switches 130 (shown as switches 130*a*, 130*b*, and 130*c*, without limitation to a particular number of switches).

Each test output conductor 108 (shown as test output conductors 108*a*, 108*b*, and 108*c*, without limitation to a particular number of test output conductors) is coupled at a first end to a charge lead 114 (shown as charge leads 114*a*, 114*b*, and 114*c*, without limitation to a particular number of charge leads) that delivers charge via charge source 120 (or one of multiple charge sources 120) as well as to a corresponding switch 130, and at a second opposing end to the corresponding discrete output conductor 105 (shown as discrete output conductors 105*a*, 105*b*, 105*c*, without limitation to a particular number of discrete output conductors).

When switch 130*a* is enabled by a signal provided by counting conductor 134*a* generated by counter 208*a*, a charge from the charge source is delivered via charge lead 114*a* to test output conductor 108*a* as a discrete output signal, and then to discrete output conductor 105*a* and its corresponding discrete output port 103 (shown in FIG. 1). In this way, the discrete conductor 105*a* is toggled at a frequency that corresponds to counter 208*a*. Similarly, when switch 130*b* is enabled by a signal provided by counting conductor 134*b* generated by counter 208*b*, a charge from the charge source is delivered via charge lead 114*b* to test output conductor 108*b*, and then to discrete output conductor 105*b* and its corresponding discrete output port 103 (shown in FIG. 1). Similarly, a flow of charge is allowed to flow from the charge source 120 via charge lead 114*c* to test output conductor 108*c*, and then to discrete output conductor 105*b* and its corresponding discrete output port 103 (shown in FIG. 1). Since each of the counters 208*a*, 208*b*, and 208*c* toggle at a different frequency, the charge provided to the respective discrete output conductors 105*a*, 105*b*, 105*c* is toggled at the same corresponding different frequency.

As each discrete output conductor 105 or test output conductor 108 is probed by the oscilloscope, a trace is displayed that can be compared to an expected curve (the curve of the signal output by the corresponding counter 208) to determine if a disturbance exists between the corresponding discrete output of the DUT 104 and any of the other discrete outputs.

Figure 3:
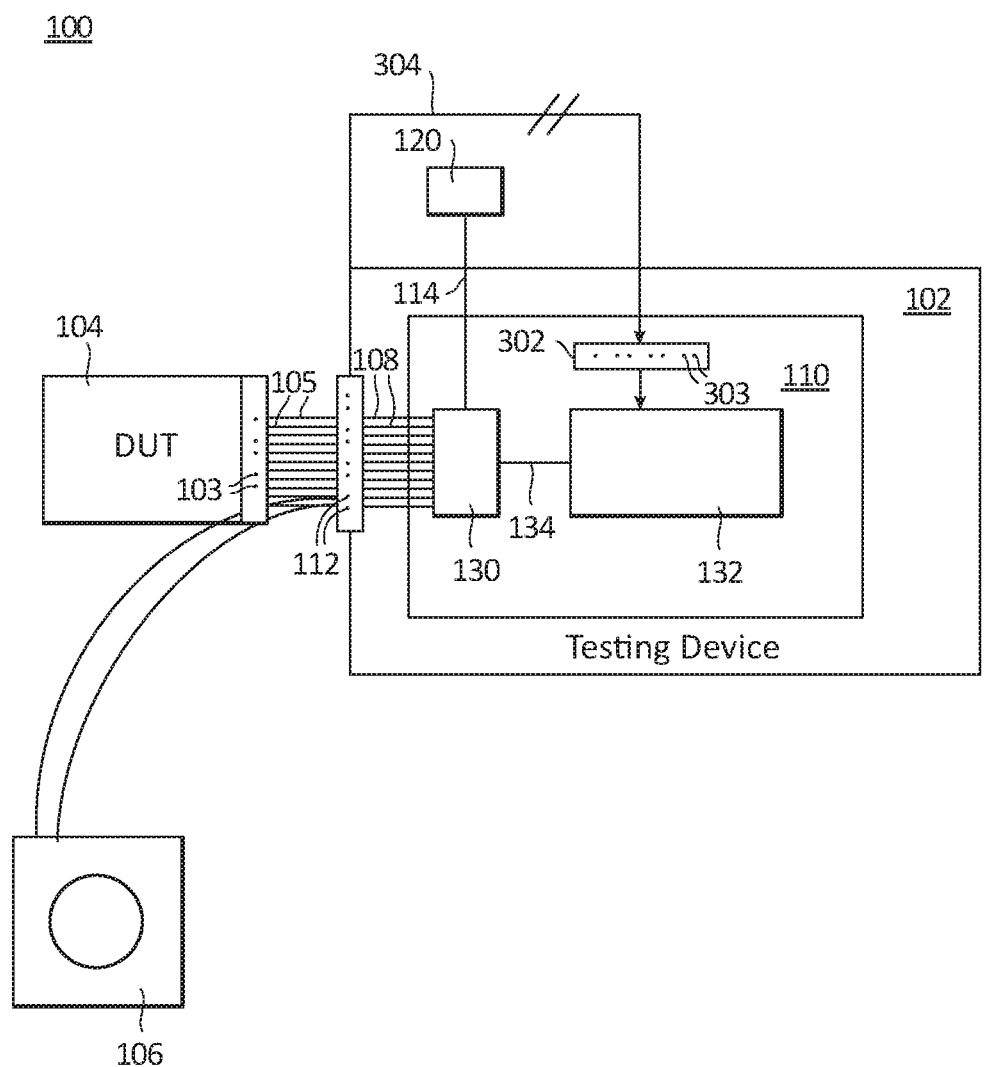
FIG. 3 is a block diagram for an example testing device in accordance with another embodiment of the disclosure.

With reference to FIG. 3, embodiments are shown in which the testing device 102 includes an input interface 302 having discrete input ports 303 that receive respective different discrete output signals transmitted along the individual charge conductors 108, wherein there is a one-to-one correspondence between the charge conductors 108 and the input ports 303. Each of the received discrete input signals can be monitored and/or measured to determine if the discrete input signal indicates that there is a disturbance between the corresponding discrete output of the DUT 104 any of the other discrete outputs of the DUT 104. In accordance with an example method, the signal received by each input port 303 is monitored and/or measured by controller 132. In an example method for detecting an open circuit, a short circuit between discrete output signals, or a short circuit between a discrete output signal and ground an input counter (not shown) can generate a tick each time the electrical quantity of one of the discrete input signals changes state, tracking the number of ticks, and multiplying the number ticks by the frequency of the counter 208 (shown in FIG. 2) that corresponds to the discrete output signal. For detection of unexpected capacitance or inductance, other methods can be used, such as obtaining frequent samples of the signals received at the input ports 303 and comparing these signals to an expected value.

FIGS. 4A-4E show simulated examples of types of failures that discrete output may face by showing traces of three discrete output signals and expected traces for each of the discrete output signals. Each of the simulations was performed using a circuit similar to the circuit shown in FIG. 2 with a different induced failure. The simulations were performed in LT Spice®. In FIGS. 4A-4E, a plot is shown having traces 402, 404, and 406 that show the probed signals output to discrete output conductors 105A, 105B, and 105C, respectively. Traces 412, 414, and 416 show the expected curves for each of respective traces 402, 404, and 406. As shown, by traces 402, 404, 406 and 412, 414, and 416, the discrete output signals that corresponds to each trace are applied simultaneously at different frequencies.

Figure 4A:
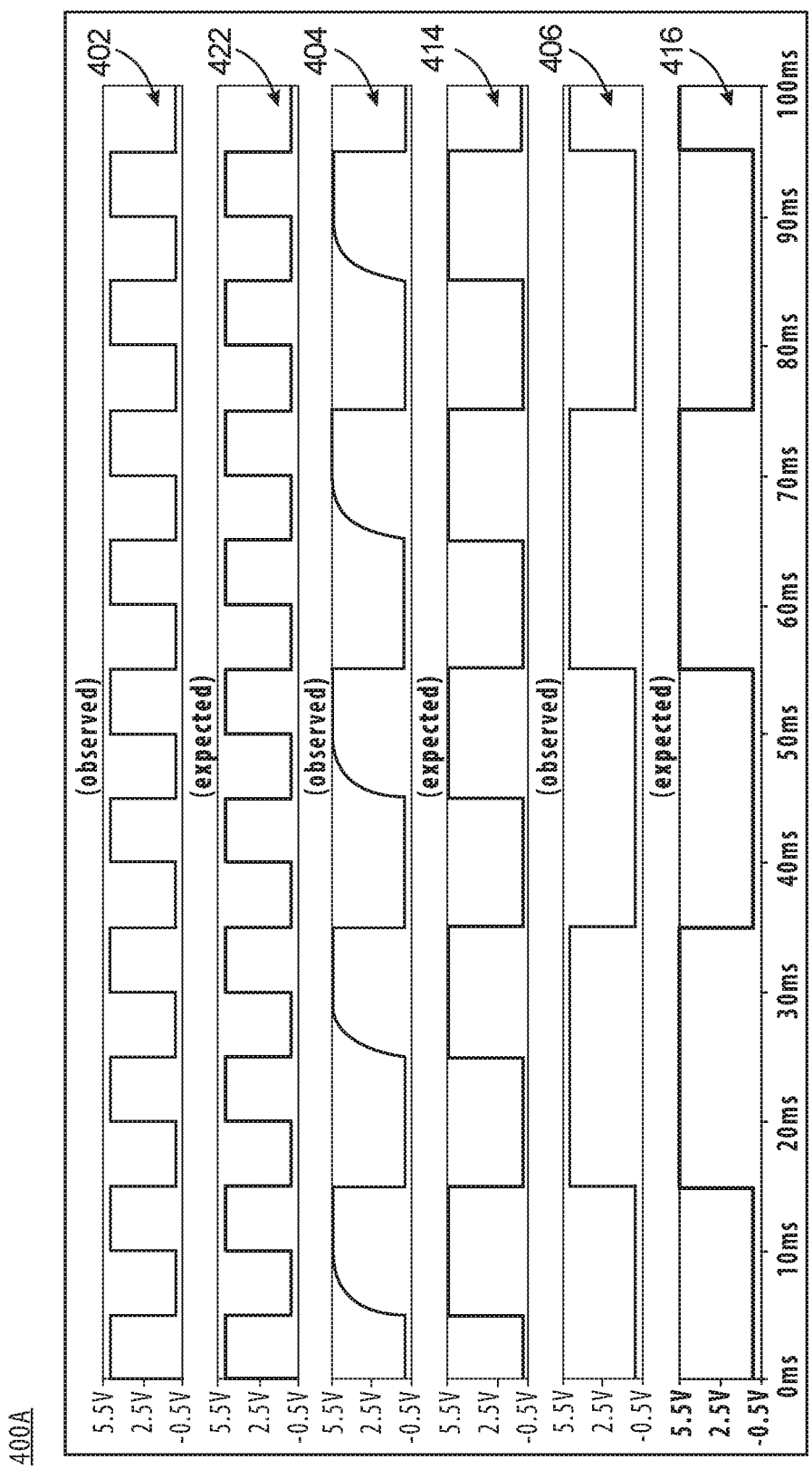

In FIG. 4A, a plot 400A shows that traces 402 and 406 follow expected curves 412 and 416, respectively. Trace 404 has curved leading edges that differ from expected curve 414, which indicates unexpected capacitance at on the discrete output of the DUT 104 that corresponds to the discrete output signal shown in trace 404.

In FIG. 4B, a plot 400B shows that traces 404 and 406 follow expected curves 414 and 416, respectively. Trace 402 is different from expected curve 412. Rather, trace 402 is the same as trace 404, indicating that the discrete output of the DUT 104 that corresponds to the discrete output signals shown in traces 402 and 404 form a short circuit.

Figure 4C:
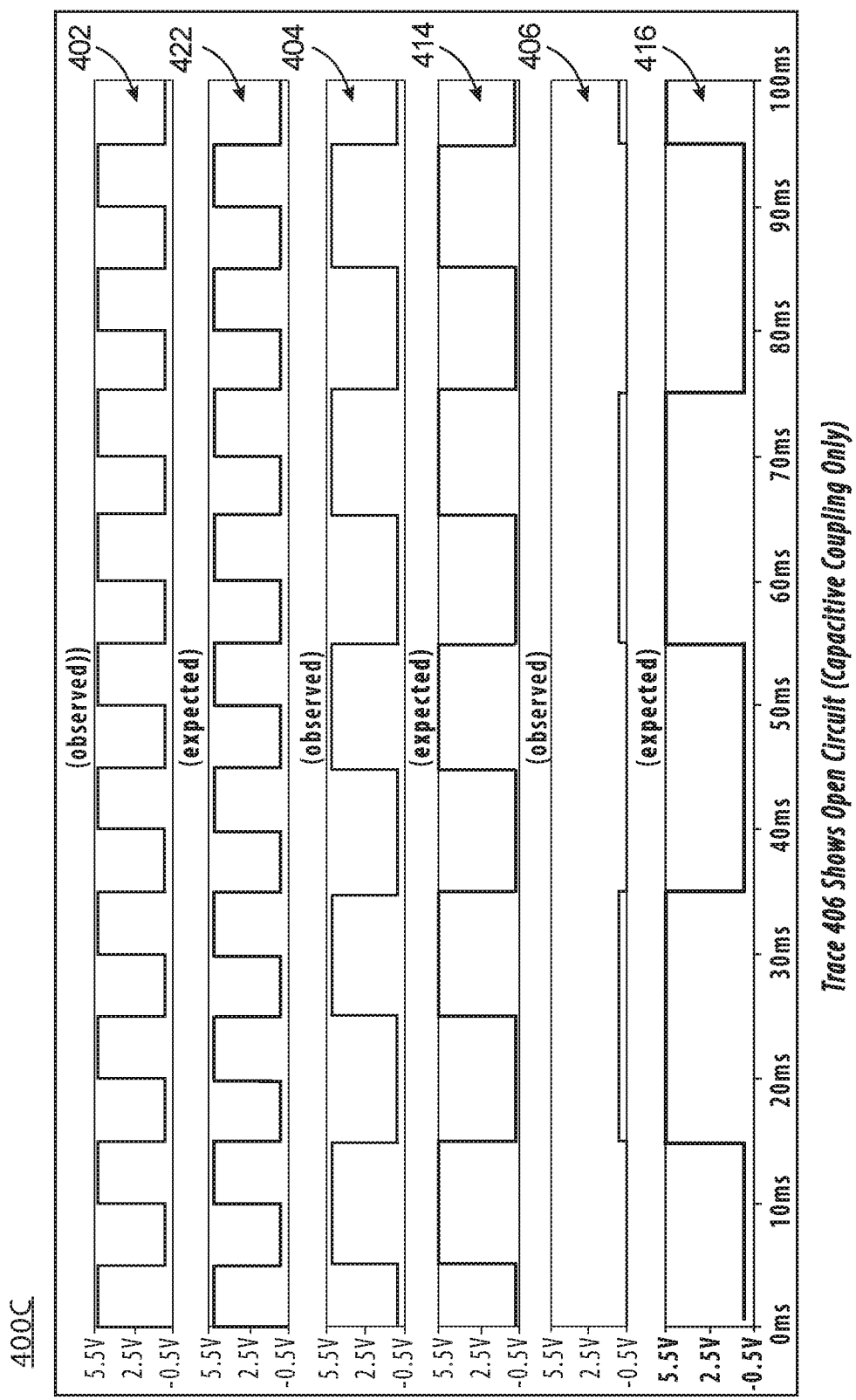

In FIG. 4C, a plot 400C shows that traces 402 and 404 follow expected curves 412 and 414, respectively. Trace 404 is different from expected curve 414. Rather, trace 404 is substantially flat in shape having only a slight change in amplitude, indicating that the discrete output of the DUT 104 that corresponds to the discrete output signals shown in traces 406 forms an open circuit, wherein the slight change in amplitude is due only to capacitive coupling.

In FIG. 4D, a plot 400D shows that traces 404 and 406 follow expected curves 414 and 416, respectively. Trace 402 is different from expected curve 412. Rather, trace 402 is flat, indicating that the discrete output of the DUT 104 that corresponds to the discrete output signals shown in trace 402 is shorted to ground.

In FIG. 4E a plot 400E shows that traces 402 and 404 follow expected curves 412 and 414, respectively. Trace 406 is different from expected curve 416. Trace 406 has noise and curvature along its trailing edges that differ from expected curve 416, which indicates unexpected inductance at on the discrete output of the DUT 104 that corresponds to the discrete output signal shown in trace 406.

Figure 5:
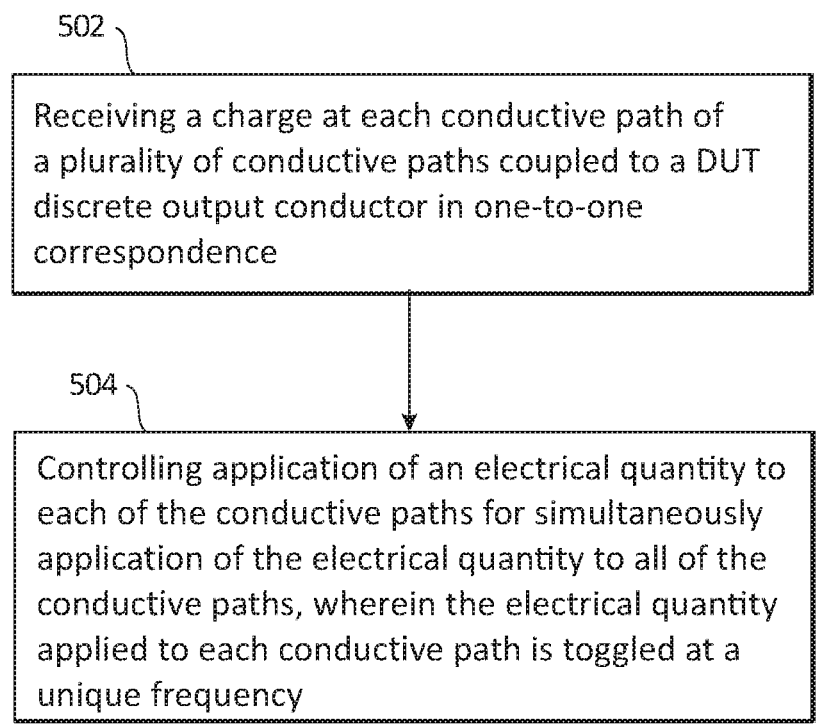
FIG. 5 is a flowchart of an example method performed by a testing device in accordance with an embodiment of the disclosure, such as the testing device shown in FIG. 1.

FIG. 5 shows an exemplary and non-limiting flowchart 500 illustrating a method for testing discrete output signals of a DUT in accordance with certain illustrated embodiments. The method can be performed by a testing device, such as testing device 102 shown in FIGS. 1-3. Before turning to description of FIG. 5, it is noted that the flowchart in FIG. 5 shows an example in which operational steps are carried out in a particular order, as indicated by the lines connecting the blocks, but the various steps shown in this diagram can be performed in a different order, or in a different combination or sub-combination. It should be appreciated that in some embodiments some of the steps described below may be combined into a single step. In some embodiments, one or more additional steps may be included. In some embodiments, one or more of the steps can be omitted.

Operation 502 includes receiving a charge at each conductive path of a plurality of conductive paths coupled to a DUT discrete output conductor in one-to-one correspondence.

Operation 504 includes controlling application of charge to each of the conductive paths for simultaneously application of charge to all of the conductive paths, wherein the charge applied to each conductive path is toggled at a unique frequency having a unique period. Operation 504 can include switching application of the charge to the conductive paths, wherein switching application of the charge toggles the charge applied to each of the conductive paths at its unique frequency. Operation 504 can use a counter that counts to a counting value having multiple bits, wherein each bit controls the switching application of the charge to a different one of the conductive paths.

Aspects of the present disclosure are described above with reference to block diagrams of methods, apparatus (systems) and computer program products according to embodiments of the disclosure. Features of the methods described include operations, such as equations, transformations, conversions, etc., that can be performed using software, hardware, and/or firmware. Regarding software implementations, it will be understood that individual blocks of the block diagram illustrations and combinations of blocks in the block diagram illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

Figure 6:
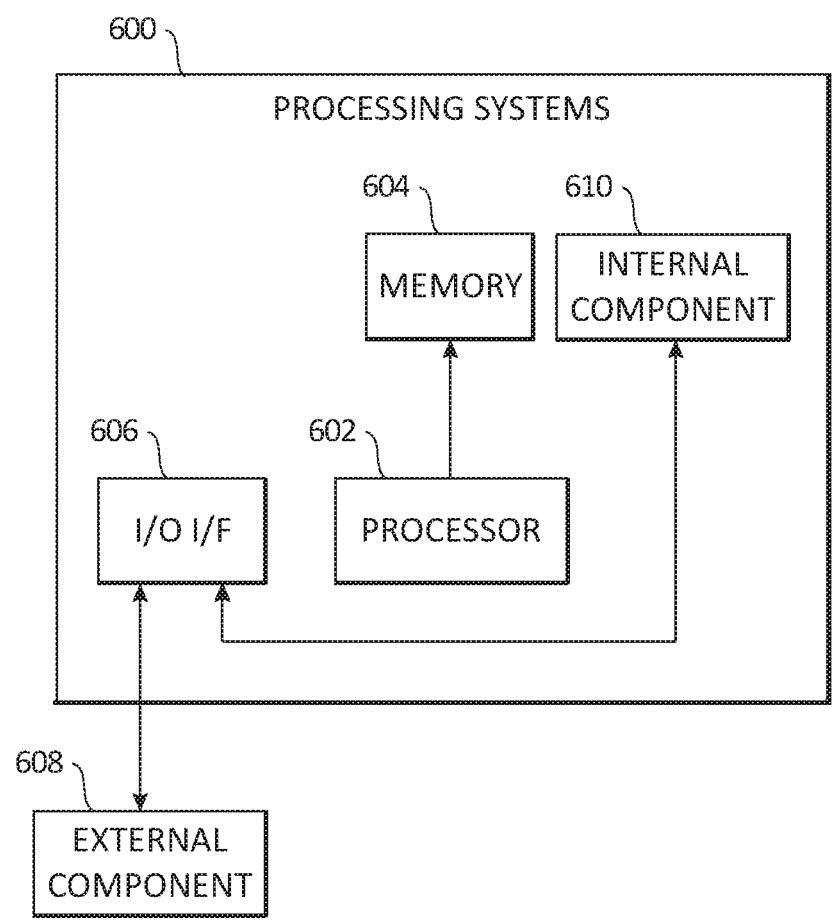
FIG. 6 is a block diagram of an exemplary computer system configured to implement components of a controller or control circuit of the testing device of FIGS. 1-3.

With reference to FIG. 6, a block diagram of an example computing system 600 is shown, which provides an example configuration of the controller 132 or one or more portions of the controller 132. Additionally, all or portions of the control circuit 110, in addition to controller 132, could be configured as software, and computing system 600 could represent such portions. Computing system 600 is only one example of a suitable system and is not intended to suggest any limitation as to the scope of use or functionality of embodiments of the disclosure described herein. Computing system 600 can be implemented using hardware, software, and/or firmware. Regardless, computing system 600 is capable of being implemented and/or performing functionality as set forth in the disclosure.

Computing system 600 is shown in the form of a general-purpose computing device. Computing system 600 includes a processing device 602, memory 604, an input/output (I/O) interface (I/F) 606 that can communicate with an internal component 610, and optionally an external component 608.

The processing device 602 can include, for example, a PLD, microprocessor, DSP, a microcontroller, an FPGA, an ASIC, and/or other discrete or integrated logic circuitry having similar processing capabilities.

The processing device 602 and the memory 604 can be included in components provided in the FPGA, ASIC, microcontroller, or microprocessor, for example. Memory 604 can include, for example, volatile and non-volatile memory for storing data temporarily or long term, and for storing programmable instructions executable by the processing device 602. I/O I/F 606 can include an interface and/or conductors to couple to the one or more internal components 608 and/or external components 610.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow diagram and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the block diagram block or blocks.

Embodiments of the controller 132 (or other portions of control circuit 110) may be implemented or executed by one or more computer systems, such as a microprocessor. Each computer system 600 can implement controller 132, or multiple instances thereof. In various embodiments, computer system 600 may include one or more of a microprocessor, an FPGA, application specific integrated circuit (ASIC), microcontroller. The computer system 600 can be provided as an embedded device. All or portions of the computer system 600 can be provided externally, such by way of a mobile computing device, a smart phone, a desktop computer, a laptop, or the like.

Computer system 600 is only one example of a suitable system and is not intended to suggest any limitation as to the scope of use or functionality of embodiments of the disclosure described herein. Regardless, computer system 600 is capable of being implemented and/or performing any of the functionality set forth hereinabove.

Computer system 600 may be described in the general context of computer system-executable instructions, such as program modules, being executed by a computer system. Generally, program modules may include routines, programs, objects, components, logic, data structures, and so on that perform particular tasks or implement particular abstract data types.

Potential advantages provided by the disclosed method and system include the ability to test all combinations of discrete output signals output by a DUT in a practical, economical, and efficient matter when the DUT is an engineering prototype that is not yet a final product. Further potential advantages include obviating the need for manual stimulation of the discrete output signals, which can be a time-consuming process, particularly when testing every combination of output state.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the illustrated embodiments, exemplary methods and materials are now described. All publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A testing device for testing discrete output conductors of a device under test (DUT), the testing device comprising:
   a plurality of test output conductors for receiving an electrical quantity, the electrical quantity being voltage, current, or charge, and for coupling to respective discrete DUT output conductors of the DUT in one-to-one correspondence at only an output side of the DUT; and
   a control circuit for independently controlling application of the electrical quantity to each test output conductor of the plurality of test output conductors, wherein the application of the electrical quantity is controlled independently for each test output conductor so that an electrical quantity is applied simultaneously to all of the test output conductors, and the electrical quantity applied to each test output conductors is toggled at a unique frequency having a unique period that is different than the frequency and period of the electrical quantity applied to the other test output conductors,
   wherein the control circuit comprises a counting circuit having a counter that corresponds to each test output conductor and controls the electrical quantity applied to its corresponding test output conductor,
   wherein each counter toggles between a high and a low value at the corresponding unique frequency, and each of the counters corresponds to a different bit of a counting value that is incremented for counting from a lowest value in which all counters have a low value to a highest value in which all counters have a high value,
   wherein observance or measurement of a characteristic of the electrical quantity at each of the respective discrete DUT output conductors over the duration of the counting value counting from the lowest value to the highest value provides for observing or measuring an indication of any disturbance between the signals along the discrete DUT output conductors associated with the discrete DUT output conductor and the signals along each of the other discrete DUT output conductors.

2. The testing device of claim 1, wherein the shortest period of the unique frequencies applied to the test output conductors is bound by capabilities of the discrete output signals to physically switch from a high state to a low state.

3. The testing device of claim 1, wherein the control circuit further comprises a switching circuit configured to be operated to toggle each of the test output conductors at its unique frequency.

4. The testing device of claim 3, wherein the switching circuit is configured to be operated as a function of the counting value.

5. The testing device of claim 3, wherein the switching circuit includes a plurality of switches, each switch being controlled by a respective different counter to enable application of the electrical quantity via the test output conductor coupled to the counter.

6. The testing device of claim 1, wherein the controller is one of a microprocessor, field programmable gate array, or application specific integrated circuit.

7. The testing device of claim 1, further comprising:
   a plurality of discrete input ports, wherein each discrete DUT output conductor is coupled to a different discrete input port of the plurality of discrete input ports; and
   a processing device to monitor the electrical quantity received at each discrete input port for detecting a disturbance between the discrete output signal along the discrete output conductor coupled to the discrete input port and the other discrete output signals along the discrete output conductors connected to the other discrete input ports.

8. The testing device of claim 1, wherein the unique period at which electrical quantity applied to each but one of respective the test output conductors is toggled is a multiple of a period at which the electrical quantity applied to another of the test output conductors is toggled for facilitating the counting from the lowest value of the counting value to the highest value of the counting value.

9. The testing device of claim 1, wherein a characteristic of the electrical quantity is measured or observed at each of the respective discrete DUT output conductors over the duration of the counting value counting from the lowest value to the highest value.

10. The testing device of claim 8, wherein the testing device with the plurality of discrete input ports and the processing device is provided on an integrated circuit.

11. The testing device of claim 8, wherein monitoring the electrical quantity includes counting the number of changes between a state of the electrical quantity at each discrete input port.

12. The testing device of claim 1, wherein the DUT is an engineering prototype that is not yet a final product.

13. A method of testing discrete output conductors of a device-under-test (DUT), the method comprising:
   receiving an electrical quantity at each conductive path of a plurality of conductive paths that are each coupled to a respective discrete DUT output conductors of the DUT in one-to-one correspondence at only an output side of the DUT; and
   controlling application of the electrical quantity to each of the conductive paths independent of application of the electrical quantity along the other conductive paths, so that an electrical quantity is applied simultaneously to all of the conductive paths, the electrical quantity applied to each conductive path being toggled by a counter between a high and a low value at a unique frequency having a unique period that is different than the frequency and period of the electrical quantity applied to the other test output conductors, wherein each of the counters corresponds to a different bit of a counting value that is incremented for counting from a lowest value in which all counters have a low value to a highest value in which all counters have a high value, wherein observance or measurement of a characteristic of the electrical quantity at each of the respective discrete DUT output conductors over the duration of the counting value counting from the lowest value to the highest value provides for observing or measuring an indication of any disturbance between the signals along the discrete DUT output conductors associated with the discrete DUT output conductor and the signals along each of the other discrete DUT output conductors.

14. The method of claim 13, wherein the shortest period of the unique frequencies applied to the test output conductors is bound by capabilities of the discrete output signals to physically switch from a high state to a low state.

15. The method of claim 13, further comprising switching application of the electrical quantity to the conductive paths, wherein switching application of the electrical quantity toggles the electrical quantity applied to each of the conductive paths at its unique frequency.

16. The method of claim 13, further comprising:
receiving each discrete output signal; and
monitoring each discrete output signal for detecting a disturbance between each discrete output signal and all of the other discrete output signals.

17. The method of claim 16, wherein monitoring the discrete output signal includes counting the number of changes between a state of the electrical quantity of each discrete output signal being monitored.

18. The method of claim 13, further comprising measuring or observing each discrete output signal over the duration of the longest period.

* * * * *